United States Patent
Yang et al.

(10) Patent No.: US 6,653,191 B1
(45) Date of Patent: Nov. 25, 2003

(54) MEMORY MANUFACTURING PROCESS USING BITLINE RAPID THERMAL ANNEAL

(75) Inventors: Jean Y. Yang, Sunnyvale, CA (US); Arvind Halliyal, Cupertino, CA (US); Amir H. Jafarpour, Pleasanton, CA (US); Tazrien Kamal, San Jose, CA (US); Mark T. Ramsbey, Sunnyvale, CA (US); Emmanuil Lingunis, San Jose, CA (US); Hidehiko Shiraiwa, San Jose, CA (US)

(73) Assignees: Advanced Micro Devices, Inc., Sunnyvale, CA (US); Fujitsu Limited, Kanagawa-ken (JP)

( * ) Notice: Subject to any disclaimer, the term of this patent is extended or adjusted under 35 U.S.C. 154(b) by 0 days.

(21) Appl. No.: 10/151,576

(22) Filed: May 16, 2002

(51) Int. Cl.$^7$ .......................................... H01L 21/8247
(52) U.S. Cl. ...................... 438/258; 438/261; 438/530
(58) Field of Search ................................. 438/216, 258, 438/261, 275, 276, 287, 308, 530, 954

(56) References Cited

U.S. PATENT DOCUMENTS

| | | | | |
|---|---|---|---|---|
| 4,151,008 A | * | 4/1979 | Kirkpatrick | 438/530 |
| 5,349,221 A | * | 9/1994 | Shimoji | 257/324 |
| 6,030,871 A | * | 2/2000 | Eitan | 438/276 |
| 6,346,442 B1 | * | 2/2002 | Aloni et al. | 438/261 |

OTHER PUBLICATIONS

Wolf, "Silicon Processing for the VLSI Era", 1986, vol. 1, pp. 56–58, 307–308, 325–326.*

* cited by examiner

*Primary Examiner*—Chandra Chaudhari
(74) *Attorney, Agent, or Firm*—Mikio Ishimaru

(57) ABSTRACT

A method of manufacturing an integrated circuit includes providing a semiconductor substrate and depositing a charge-trapping dielectric layer and a gate dielectric layer over the semiconductor substrate. Bitlines are implanted closely in the semiconductor substrate and annealed using a rapid thermal anneal. Wordlines and gates are formed and source/drain junctions are implanted in the semiconductor substrate. An interlayer dielectric layer is deposited and the integrated circuit completed.

18 Claims, 4 Drawing Sheets

MEMORY MANUFACTURING PROCESS USING BITLINE RAPID THERMAL ANNEAL

BACKGROUND OF THE INVENTION

1. Technical Field

The present invention relates generally to semiconductor technology and more specifically to reducing the number of steps in forming MirrorBit® Flash memory.

2. Background Art

Different types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem has been that the diffusion of the bitlines limits how closely the bitlines can be placed and this in turn limits how far the memory cells can be reduced in size.

With the urgency of reducing device size, a solution to this problem has been long sought but has long eluded those skilled in the art.

DISCLOSURE OF THE INVENTION

The present invention provides a method of manufacturing an integrated circuit, which includes providing a semiconductor substrate and depositing a charge-trapping dielectric layer and a gate dielectric layer over the semiconductor substrate. Bitlines are implanted closely in the semiconductor substrate and annealed using a rapid thermal anneal, which allows the bitlines to be more closely spaced than possible with the prior art. Wordlines and gates are formed and source/drain junctions are implanted in the semiconductor substrate. An interlayer dielectric layer is deposited and the integrated circuit completed.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
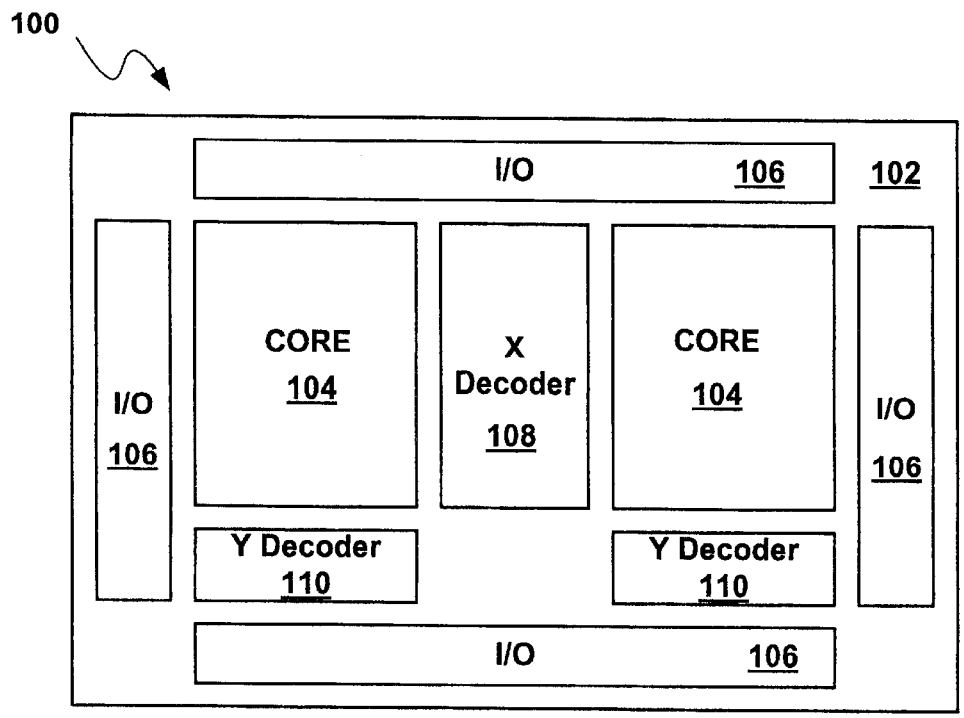
FIG. 1 is a plan view of a MirrorBit Flash EEPROM according to the present invention.

Referring now to FIG. 1, therein is shown a plan view of a MirrorBit® Flash EEPROM 100, which commonly includes a semiconductor substrate 102 in which one or more high-density core regions and one or more low-density peripheral portions are formed. The EEPROM 100 is manufactured according to the process of the present invention. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "thick", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
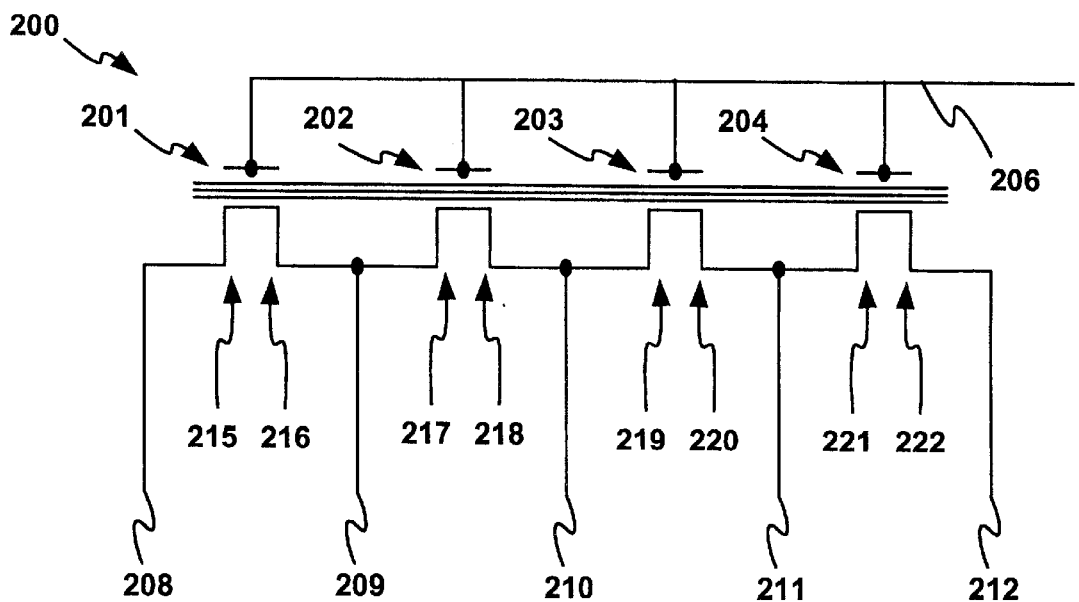
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
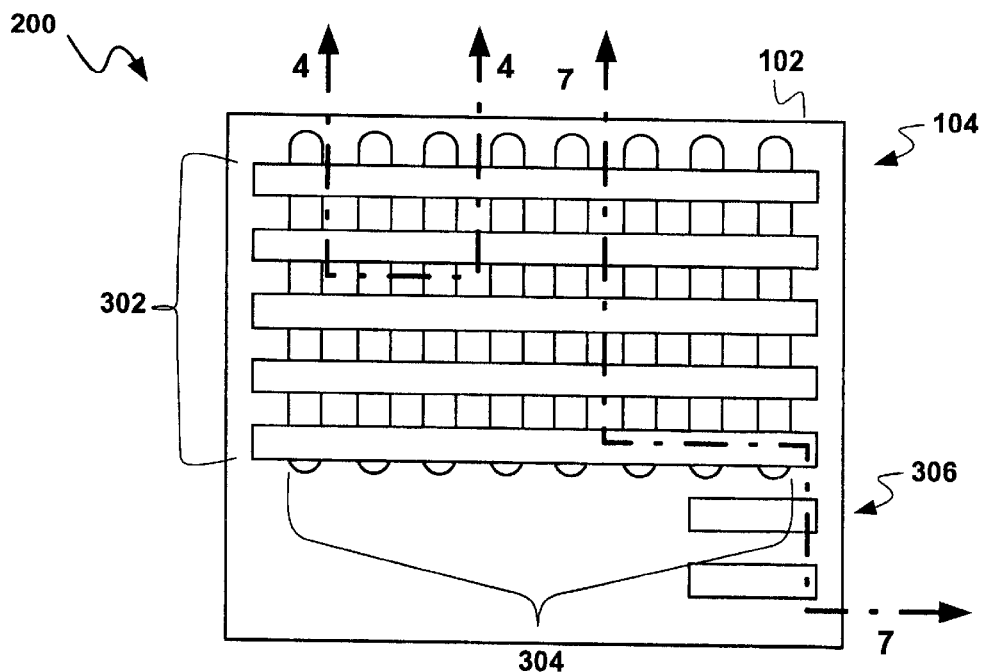
FIG. 3 is a plan view of a portion of one of the M×N array cores and periphery gates of FIG. 1.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to transistors 306 of the programming circuitry represented in part by x-decoders 108 and y-decoders 110 of FIG. 1.

Figure 4:
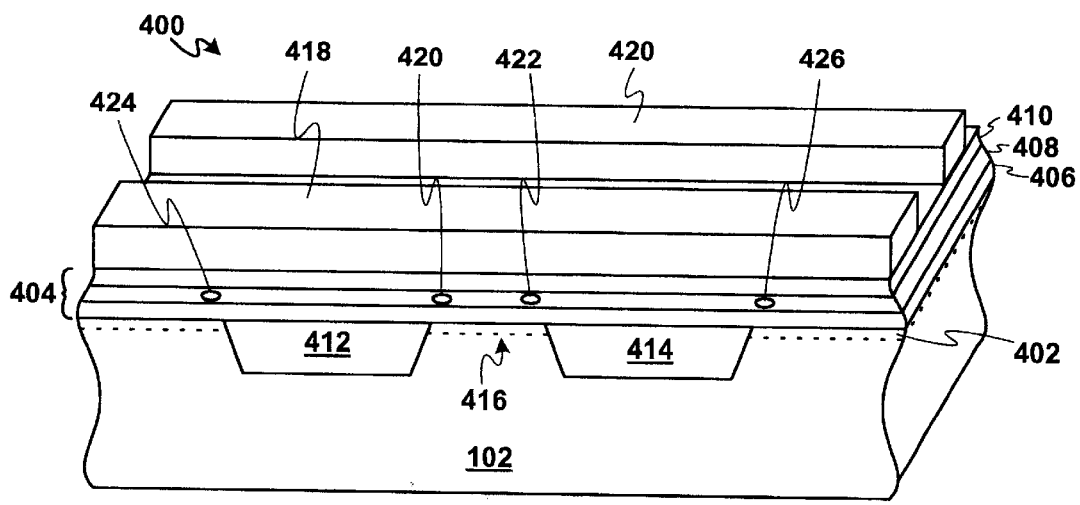
FIG. 4 is a cross-sectional isometric view of a memory cell along the line 4A—4A of FIG. 3.

Referring now to FIG. 4, therein is shown a cross-sectional isometric view of a typical MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps.

The locations 420 through 422 indicate where bits can be stored in the memory cell 400 and locations 424 and 426 are adjacent locations, which are independent of the memory cell 400.

Figure 5:
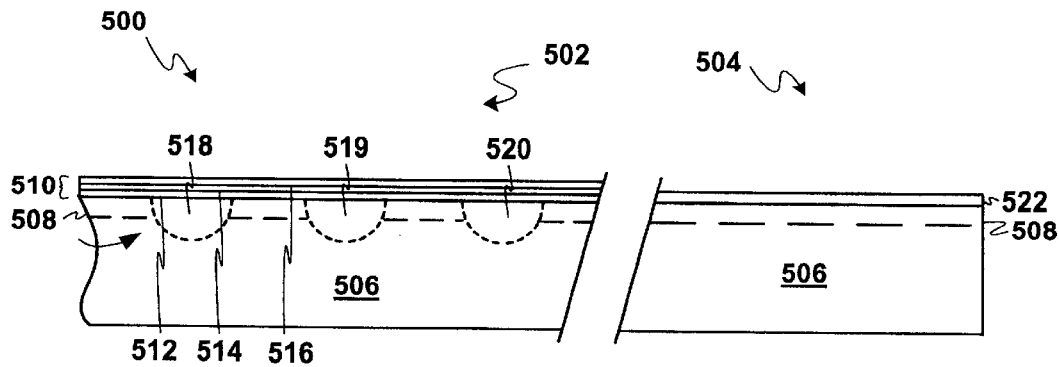
FIG. 5 is a cross-sectional view of a partially processed EEPROM, including a core region and a periphery region covered by various layers of material and implantation of bitlines.

Referring now to FIG. 5, therein is shown a cross-sectional view of a partially processed EEPROM 500, which has a silicon substrate 506, a core region 502, which will be densely covered with MirrorBit Flash cells when processing is complete, and a periphery region 504, which will be less dense and will have other control devices thereon.

In the core region 502, where memory cells are to be formed, a p-type silicon substrate 506 has been implanted or processed with a p-type threshold adjustment implant 508. A charge-trapping dielectric layer 510 is deposited over the silicon substrate 506. The charge-trapping dielectric layer 510 generally can be composed of three separate layers: a first insulating layer 512, a charge-trapping layer 514, and a second insulating layer 516. The and second insulating layers 512 and 516 may be of an oxide dielectric such as silicon dioxide ($SiO_2$) and the charge-trapping layer 514 may be of a nitride dielectric such as silicon nitride (SiN) to form an ONO layer. It will be noted that the present invention is not limited to specific dielectric or charge-trapping materials. The bitlines 518 through 520, which may be n-type bitlines, are implanted under the charge-trapping dielectric layer 510 in the silicon substrate 506.

The spacing between the bitlines 518 through 520 is determined by the thermal budget, or temperature versus time that the entire EEPROM 100 will be subject to before completion. This is because the size of the bitlines will increase due to dopant diffusion with each thermal process that is applied. In the past, relatively slow thermal anneals were used to assure proper annealing in each annealing step. For example, one to two hours at 700° C. to 1100° C. anneals were used previously to thermally process oxide depositions to assure the formation of high quality, defect-free oxide layers, such as for interlayer dielectric layer deposition. Thus, the bitlines had to be spaced about $0.5\mu$–$1.0\mu$ apart.

In the present invention, it has been discovered that the bitlines can be spaced below about $0.25\mu$ apart by using a rapid thermal anneal (RTA) of under about 3 minutes at about 500° C. to 600° C. and also having various other normal annealing steps converted to similar RTAs.

In the periphery region 504, where transistors will be formed, a gate dielectric layer 522 is deposited or grown on the silicon substrate 506. The gate dielectric layer 522 is a silicon dioxide, nitrogen oxide, or a high-k dielectric material, such as tantalum oxide, aluminum oxide, or hafnium oxide.

The gate dielectric layer used to be subject to a slow thermal anneal, but it has been discovered that, as the device is reduced in size, a high temperature oxide formed at under about 3 minutes at about 700° C. to 1100° C. will produce adequate gate dielectric layers such as the gate dielectric layer 522.

Figure 6:
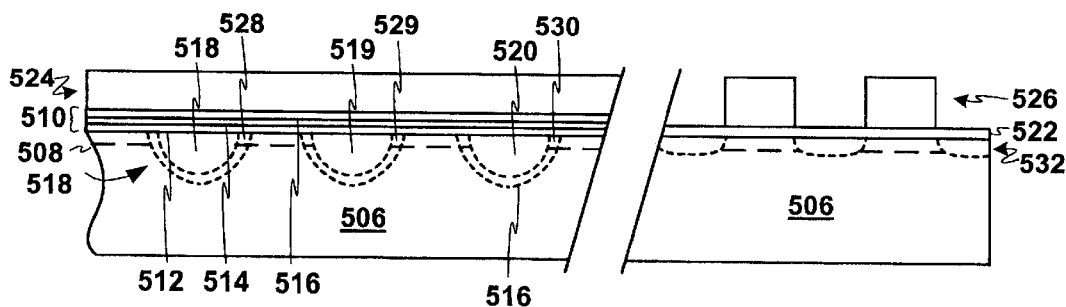
FIG. 6 is the structure of FIG. 5 after formation of wordlines and gates, and implantation of source/drain junctions.

Referring now to FIG. 6, therein is shown the structure of FIG. 5 after RTA of the gate dielectric layer 522, which causes the bitlines 518 through 520 to diffuse to form intermediate bitlines 528 through 530. The intermediate bitlines 528 through 530 can be closer together than in the prior art since they will not grow as much as in the prior art. After the RTA of under about 3 minutes at about 700° C. to 1100° C., a wordline-gate layer, of a material such as polysilicon, is deposited and patterned to form a wordline 524 in the core region 502 and gates 526 in the periphery region 504. Also shown are source/drain junctions 532, which are implanted into the semiconductor substrate 506 adjacent to the gates 526.

Figure 7:
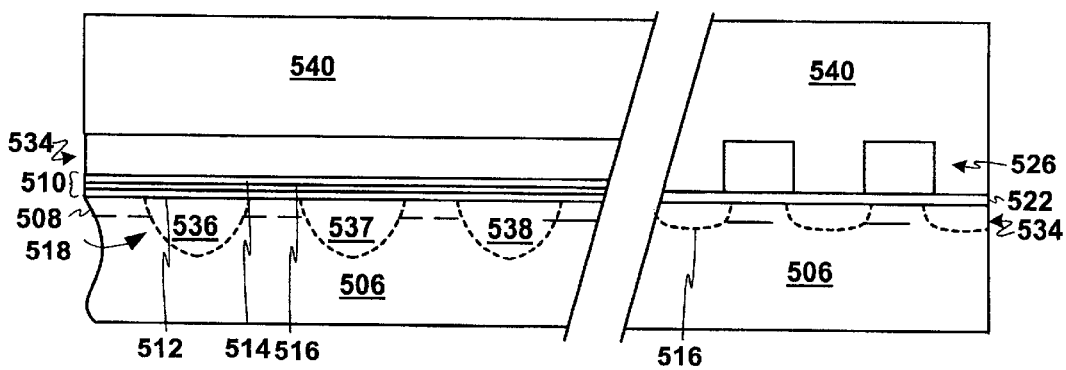
FIG. 7 is the structure of FIG. 6 after deposition of an interlayer dielectric layer and densification.

Referring now to FIG. 7, therein is shown the structure of FIG. 6 after an RTA of about 3 minutes at about 700° C. to 1100° C. of the source/drain junctions 532 to diffuse the dopant thereof to form intermediate source/drain junctions 534. This causes the growth of the intermediate bitlines 528 through 530 to form further intermediate bitlines 536 through 538. Again, The further intermediate bitlines 536 through 538 can be closer together than in the prior art since they will not grow as much as in the prior art due to the use of RTAs.

Disposed above the silicon substrate 506 is an interlayer dielectric layer 540, which can be of a material such as borophosphosilicate glass (BPSG). The interlayer dielectric layer 540 is included in the thermal budget and is heated by an RTA of under about 3 minutes at about 700° C. to 1100° C. to densify the layer.

Figure 8:
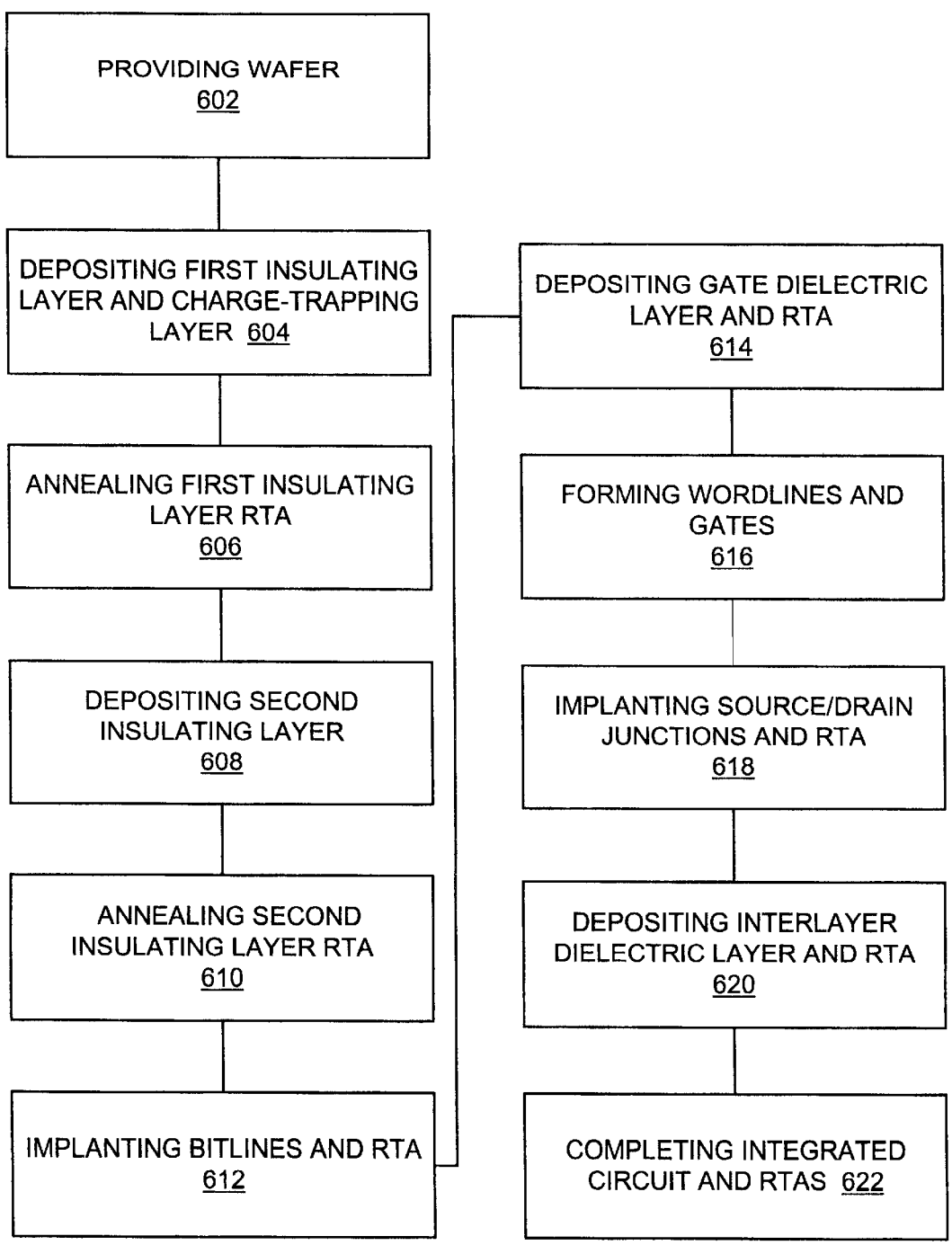
FIG. 8 is a simplified flow chart in accordance with the present invention.

Referring now to FIG. 8, therein is shown a simplified process chart 600 of the present invention which includes: providing wafer 602; depositing first insulating layer and charge-trapping layer 604; annealing first insulating layer RTA 606; depositing second insulating layer 608; annealing second insulating layer RTA 610; depositing gate dielectric layer and RTA 612; implanting bitlines and RTA 614; forming wordlines and gates 616; implanting source/drain junctions and RTA 618; depositing interlayer dielectric layer and RTA 620; completing integrated circuit and RTAs 622.

Various alternative sequences, additions, and deletions to this process chart would be obvious to those skilled in the art from a detailed reading of the present disclosure. Essentially, every previous annealing process can be a RTA, or a thermal anneal performed in under about three minutes. The figures provided herein have been discovered to be critical times and temperature ranges for the structures involved so as to minimize bitline diffusion. For example, RTAs should be performed of under about 2 minutes at about 900° C. to 1000° C. for dielectric anneal; of under about 1 minute at about 500° C. to 700° C. for salicidation; and of under about 3 minutes at about 1000° C. to 1100° C. for junction activation.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

providing a semiconductor substrate;

depositing a charge-trapping dielectric material over the semiconductor substrate;

depositing a gate dielectric material over the semiconductor substrate;

implanting bitlines in the semiconductor substrate;

annealing the bitlines uses a rapid thermal anneal of about 3 minutes below about 600° C. to maintain the bitlines spaced below about $0.25\mu$ apart;

forming wordlines and gates;

implanting source/drain junctions in the semiconductor substrate;

depositing an interlayer dielectric layer; and completing the integrated circuit.

2. The method of manufacturing an integrated circuit as claimed in claim 1 including annealing the gate dielectric layer in the semiconductor substrate uses a rapid thermal anneal.

3. The method of manufacturing an integrated circuit as claimed in claim 1 including annealing the source/drain junctions in the semiconductor substrate uses a rapid thermal anneal.

4. The method of manufacturing an integrated circuit as claimed in claim 1 including annealing the interlayer dielectric layer uses a rapid thermal anneal.

5. The method of manufacturing an integrated circuit as claimed in claim 1 including completing the integrated circuit using only rapid thermal anneals.

6. The method of manufacturing an integrated circuit as claimed in claim 1 wherein depositing the charge-trapping dielectric material deposits:

a first dielectric material, a charge-trapping material over the first dielectric material, and a second dielectric material over the charge-trapping material.

7. The method of manufacturing an integrated circuit as claimed in claim 1 including annealing salicidation uses a rapid thermal anneal.

8. The method of manufacturing an integrated circuit as claimed in claim 1 wherein annealing the source/drain junctions uses a rapid thermal anneal of about 3 minutes below about 1100° C.

9. The method of manufacturing an integrated circuit as claimed in claim 1 wherein annealing the charge-trapping dielectric material uses a rapid thermal anneal of about 2 minutes below about 1000° C.

10. A method of manufacturing an integrated circuit comprising:

providing a silicon substrate;

depositing a oxide-nitride-oxide layer over the silicon substrate;

depositing a gate oxide layer over the silicon substrate;

implanting bitlines in the silicon substrate;

annealing the bitlines uses a rapid thermal anneal of under about 3 minutes between about 500° C. and 600° C. to maintain the bitlines spaced below about 0.25µ apart;

forming wordlines and gates;

implanting source/drain unctions in the silicon substrate;

depositing an interlayer dielectric layer; and completing the integrated circuit.

11. The method of manufacturing an integrated circuit as claimed in claim 10 including annealing the gate oxide layer in the silicon substrate uses a rapid thermal anneal of under about 3 minutes between about 900° C. and about 1100° C.

12. The method of manufacturing an integrated circuit as claimed in claim 10 including annealing the source/drain junctions in the silicon substrate uses a rapid thermal anneal of under about 3 minutes between about 600° C. and about 100° C.

13. The method of manufacturing an integrated circuit as claimed in claim 10 including annealing the interlayer dielectric layer uses a rapid thermal anneal of under about 2 minutes between about 900° C. and about 1000° C.

14. The method of manufacturing an integrated circuit as claimed in claim 10 including salicidation using a rapid thermal anneal of under about 1 minute between about 500° C. and about 700° C.

15. The method of manufacturing an integrated circuit as claimed in claim 10 including completing the integrated circuit using only rapid thermal anneals with each of under about 3 minutes between about 500° C. and about 1100° C.

16. The method of manufacturing an integrated circuit as claimed in claim 10 wherein depositing the charge-trapping dielectric layer deposits:

a first dielectric layer, a charge-trapping layer over the first dielectric layer, and a second dielectric layer over the charge-trapping layer.

17. The method of manufacturing an integrated circuit as claimed in claim 10 wherein annealing the source/drain junctions uses a rapid thermal anneal of under about 3 minutes between about 700° C. to 1100° C.

18. The method of manufacturing an integrated circuit as claimed in claim 10 wherein annealing the charge-trapping dielectric layer uses a rapid thermal anneal of under about 2 minutes between about 900° C. to 1000° C.

* * * * *